United States Patent [19]

Murata et al.

[11] 4,058,443

[45] Nov. 15, 1977

[54] RECORDING MATERIAL

[75] Inventors: Masataka Murata; Keiji Takeda; Teppei Ikeda, all of Asaka, Japan

[73] Assignee: Fuji Photo Film Co., Ltd., Minami-ashigara, Japan

[21] Appl. No.: 644,682

[22] Filed: Dec. 29, 1975

[30] Foreign Application Priority Data

Dec. 26, 1974  Japan .................................. 49-444

[51] Int. Cl.$^2$ ........................ C08F 2/50; C08F 4/00
[52] U.S. Cl. ............................ 204/159.17; 96/35.1; 96/115 P; 204/159.16; 204/159.18; 204/159.19; 204/159.2; 260/17 R; 260/888; 260/890; 260/897 A; 260/897 C; 260/897 B
[58] Field of Search ................ 204/159.17; 96/115 P, 96/35.1

[56] References Cited

U.S. PATENT DOCUMENTS 3,764,324  10/1973  Reyes ........................... 96/115 P

FOREIGN PATENT DOCUMENTS 614,181  2/1961  Canada .............................. 96/115 P
1,1190/71  3/1971  Japan

*Primary Examiner*—Howard E. Schain
*Assistant Examiner*—W. C. Danison, Jr.
*Attorney, Agent, or Firm*—Sughrue, Rothwell, Mion, Zinn and Macpeak

[57] ABSTRACT

A recording material comprising a support having coated thereon a layer of a photopolymerizable composition comprising (a) a chlorinated polyolefin, (b) a monomer having at least one addition-polymerizable unsaturated bond, (c) a photo-polymerization initiator, and (d) a polymeric material having a molecular weight above about 10,000 is described. This recording material is suited for use as a photoresist material, particularly for tenting.

10 Claims, No Drawings

RECORDING MATERIAL

BACKGROUND OF THE INVENTION

1. Field of the Invention

The present invention relates to a recording material having a layer of a photopolymerizable composition.

2. Description of the Prior Art

As photoresist materials for making printed circuits, recording materials of the solution processing type have commonly been used, such as photosensitive liquids comprising a combination of dichromate and glue, poly(vinyl alcohol), or the like; photosensitive liquids comprising, as main components, poly(vinyl cinnamate) and a sensitizer; photosensitive liquids comprising, as main components, natural or cyclized rubber and a cross linking agent; and the like.

Still other recording materials of the solution processing type are those having a structure where a photosensitive layer is sandwiched between two plastic films. Upon the use of this kind of recording material, one of the films is stripped off to expose the photosensitive layer, the photosensitive layer is laminated on a desired base for a printed circuit, e.g., copper, and the resulting laminate is image-wise exposed through the remaining plastic film. Thereafter, the plastic film is removed, and the laminate is subjected to development in an appropriate developing solution such as an organic solvent, an aqueous alkaline solution, and the like, whereby exposed or cured parts remain on the copper base and unexposed or uncured parts are washed off into the developing solution to produce a resist pattern of the desired printed circuit. The above-described recording materials of the solution processing type, however, are cumbersome due to the use of processing solutions. In addition, the use of processing solutions is apt to cause environmental hazards.

A new type of recording material has been proposed in recent years which is capable of forming images by a dry processing utilizing the difference in adhesion to a base between exposed and unexposed areas, as described in Japanese Patent Publications No. 22,901/68 and 7,728/72. In general, this type of recording material comprises a base, for example, of plastic, metal or paper; a layer of a photopolymerizable composition containing as the principal components a polymeric binder, an unsaturated monomer, and a photopolymerization inhibitor; and a thin, transparent cover film. After exposure to an original, the cover film is peeled off to give both negative and positive (or positive and negative) images on the surfaces of the base and the film, whereby either exposed or unexposed parts of the composition remain on the base. By the use of this type of recording material, a resist pattern can be produced merely by peeling off the cover film while omitting processing in liquids as required with solution processing type recording materials. From this, a substantial savings in labor can be expected in producing printed circuits. In addition, stripping and removing can also be carried out with great ease as compared with earlier recording materials. Needless to say, this is a highly advanced technique. In the production of resist patterns according to this method, the photosensitive layer must be destroyed along boundary lines between exposed and unexposed parts, so the properties of the polymeric binding agents and monomers used are of great importance. In particular, the properties of the polymeric binder such as molecular weight, softening point, crystallinity, miscibility with other components, adhesiveness to the base, and the like are of particular importance. In addition, the formed images, which are used for a variety of uses, preferably possess properties required for their end use such as wear-resistance, chemical-resistance and weather resistance.

The quality of the materials used in photosensitive materials of the type comprising a combination of a polymeric binding agent, a monomer, and a polymerization initiator are also of great importance. However, materials used in the prior art do not always possess satisfactory properties, and hence do not always give images of satisfactory quality. For example, it is described in Japanese Patent Publication No. 9,663/63 that such polymeric materials can be used as a binder and may serve to raise the tackiness of the photosensitive layer to the substrate (e.g., a copper-coated plate) or the support, e.g., polyvinyl butyral, polyvinyl acetate, polyvinyl pyrrolidone, gelatin, coumarone-indene resins, silicone resins, rubbers, etc., and it is described in Japanese Patent Publication No. 7,728/72 that polymeric materials such as vinylidene chloride copolymers, cellulose ethers, synthetic rubbers, polyvinyl acetate copolymers, polyacrylate, polyvinyl chloride, etc. can be used as a binder. However, satisfactory results were not always obtained in actual experiments conducted using these polymeric materials in combination with various kinds of monomers and polymerization initiators.

SUMMARY OF THE INVENTION

We previously disclosed that chlorinated polyolefins possess distinguished properties as polymeric binding agents in recording materials. We have now found, however, that the mechanical strength of resists obtained therefrom is apt to be insufficient. In order to overcome this defect we performed extensive research, and, as a result, reached the present invention.

According to the present invention, there is provided a recording material comprising a support having thereon a layer of a photopolymerizable composition comprising (a) a chlorinated polyolefin, (b) a monomer having at least one addition-polymerizable unsaturated bond, and (c) a photopolymerization initiator, the composition additionally containing (d) a polymeric material having a molecular weight above about 10,000.

DETAILED DESCRIPTION OF PREFERRED EMBODIMENTS

The chlorinated polyolefins used in this invention are polymeric compounds obtained by the chlorination of polyolefins, and examples of chlorinated polyolefins are described, for example, in detail in Japanese Patent Publication No. 11,190/71. Among the chlorinated polyolefins usable in this invention, chlorinated polyethylene and/or chlorinated polypropylene are particularly preferred. Blends of cholorinated polyethylene and chlorinated polypropylene can be used in any proportion without limitation since, of course, chlorinated polyethylene or chlorinated polypropylene per se can be used.

Examples of chlorinated polyethylenes include Superchlon CPE (made by Sanyo Pulp Co. Ltd.), and Elaslene (made by Showa Denko K.K.). They have the characteristics of good weather resistance, heat resistance, burning resistance, chemical resistance, ozone resistance, etc., and can be said to be a new plastic material.

Examples of chlorinated polypropylenes include Superchlon CPP (made by Sanyo Pulp Co. Ltd.). Chlorinated polypropylenes have characteristics similar to those of chlorinated polyethylene and they are both white powders.

Chlorinated polyolefins suitable for use in the invention are those having a polymerization degree of from about 300 to about 20,000, preferably from 1,000 to 8,000, and have a chlorine content of from about 20 to about 80% by weight, preferably from 40 to 75% by weight, based on the total resin weight. Most preferred of such materials have a degree of chlorination of from 65 to 72% by weight, based on the total resin weight. The higher the chlorine content of the chlorinated polyolefin is, the greater its specific gravity and solubility in solvents. In addition, the softening point, elongation at break, tensile strength, crystallinity, etc., of a chlorinated polyolefin depend on its chlorine content, and compartibility with other resins, plasticizers, monomers, polymerization initiators, etc., also depend on the same.

As monomer component (b), there can be used any compound having at least one unsaturated bond capable of addition polymerization, preferably at most 6 of such unsaturated bonds. Examples of such unsaturated compounds include acrylates, acrylamides, methacrylates, methacrylamides, allyl compounds, vinyl ether, vinyl esters, N-vinyl compounds, styrene, crotonates, and the like.

Specific examples of compounds having one addition-polymerizable unsaturated bond include acrylates, such as acrylic acid, alkyl acrylates (preferably wherein the alkyl group has from 1 to 10 carbon atoms, most preferably from 1 to 5 carbon atoms, e.g., propyl acrylate, butyl acrylate, amyl acrylate, ethylhexyl acrylate, octyl acrylate, t-octyl acrylate, chloroethyl acrylate, hydroxyethyl acrylate, hydroxypropyl acrylate, 2,2-dimethylhydroxypropyl acrylate, 5-hydroxybenzyl acrylate, diethylene glycol monoacrylate, trimethylolpropane monoacrylate, pentaerythrytol monoacrylate, glycidyl acrylate, benzyl acrylate, methoxybenzyl acrylate, furfuryl acrylate, tetrahydrofurfuryl acrylate, etc.), and aryl acrylates (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenylacrylate, etc.); methycrylates, such as methacrylic acid, alkyl methacrylates (preferably wherein the alkyl group has from 1 to 10 carbon atoms, most preferably from 1 to 5 carbon atoms, e.g., methyl methacrylate, ethyl methacrylate, propyl methacrylate, isopropyl methacrylate, amyl methacrylate, hexyl methacrylate, of which illustrative groups are phenyl-, cresyl-, naphthyl-, tolyl-, nitrophenyl-, hydroxyphenyl-acrylamides etc.), N,N-dialkylacrylamides (preferably wherein the alkyl group has from 1 to 10 carbon atoms, most preferably from 1 to 5 carbon atoms, e.g., methyl, ethyl, butyl, isobutyl, ethylhexyl, cyclohexyl, etc.), N,N-diarylacrylamides (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl- as the aryl groups in the N,N-diaryl moiety etc.), N-methyl-N-phenylacrylamide, N-hydroxyethyl-N-methylacrylamide, N-2-acetoamidoethyl-N-acetylacrylamide, and the like; methacrylamides, such as methacrylamide, N-alkyl-methacrylamides (preferably wherein the alkyl group has from 1 to 10 carbon atoms, most preferably from 1 to 5 carbon atoms, e.g., methyl, ethyl, t-butyl, ethylhexyl, hydroxyethyl, cyclohexyl, etc.), N-arylmethacrylamides (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl-methacrylamides, etc.), N,N-dialkylmethacrylamides (preferably wherein the alkyl group has from 1 to 10 carbon atoms, most preferably from 1 to 5 carbon atoms, e.g., ethyl, propyl, butyl, etc.), cyclohexyl methacrylate, benzyl methacrylate, chlorobenzyl methacrylate, octyl methacrylate, N-ethyl-N-phenylaminoethyl methacrylate, ethylene glycol monomethacrylate, 2-hydroxyethyl methacrylate, 3-hydroxypropyl methacrylate, 2-hydroxypropyl methacrylate, 4-hydroxybutyl methacrylate, 5-hydroxybenzyl methacrylate, 2,2-dimethyl-3-hydroxypropylmethacrylate, diethylene glycol monomethacrylate, trimethylolpropane monomethacrylate, pentaerythritol monomethacrylate, glycidyl methacrylate, furfuryl methacrylate, tetrahydrofurfuryl methacrylate, etc.), and aryl methacrylates (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl-methacrylates, etc.); acrylamides, such as acrylamide, N-alkylacrylamides (preferably wherein the alkyl group has from 1 to 10 carbon atoms, most preferably from 1 to 5 carbon atoms, e.g., methyl, ethyl, propyl, butyl, t-butyl, hepthyl, octyl, cyclohexyl, benzyl, hydroxymethyl, hydroxyethyl, etc.), N-arylacrylamides (most preferably comprising 1 or 2 condensed aromatic rings, for example, a phenyl, naphthyl, substituted phenyl or substituted naphthyl group, of which N,N-diarylmethacrylamides (most preferably comprising 1 or 2 condensed aromatic rings, for example, a phenyl, naphthyl, substituted phenyl or substituted naphthyl group, of which illustrative groups are phenyl-, cresyl-, naphthyl-, tolyl-, nitrophenyl-, hydroxyphenyl-, as the aryl groups in the N,N-diaryl moiety etc.), N-hydroxyethyl-N-methylmethacrylamide, N-ethyl-N-phenylmethacrylamide, and the like; allyl compounds, where any alkyl moiety comprises from 1 to 10 carbon atoms, preferably from 1 to 5 carbon atoms, and wherein the aryl groups comprise 1 or 2 (condensed) aromatic rings, such as allyl esters (e.g., allyl acetate, allyl caprate, allyl caprylate, allyl laurate, allyl palmitate, allyl stearate, allyl benzoate, allyl acetoacetate, allyl lactate, etc.), allyloxyethanol, and the like; vinyl ethers, such as alkyl vinyl ethers (where preferably the alkyl moiety comprises from 1 to 18 carbon atoms, most preferably from 1 to 10 carbon atoms, e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.), vinyl aryl ethers (where the aryl moiety most preferably has 1 or 2 (condensed) aromatic rings, e.g., vinyl phenyl ether, vinyl tolyl ether, vinyl chlorophenyl ether, vinyl 2,4-dichlorophenyl ether, vinyl naphthyl ether, vinyl anthranyl ether, vinyl cresyl ether, vinyl nitrophenyl ether, vinyl hydroxyphenyl ether, etc.), and the like;

vinyl esters, wherein any alkyl moiety preferably has from 1 to 10 carbon atoms, most preferably 1 to 5 carbon atoms, and wherein the aryl moiety comprises 1 or 2 (condensed) aromatic rings, such as vinyl butylate, vinyl isobutylate, vinyl trimethylacetate, vinyl diethylacetate, vinyl valerate, vinyl caproate, vinyl chloroacetate, vinyl dichloroacetate, vinyl methoxyacetate, vinyl butoxy acetate, vinyl phenyl acetate, vinyl acetoacetate, vinyl lactate, vinyl β-phenylbutylate, vinyl cyclohexylcarboxylate, vinyl benzoate, vinyl salicylate, vinyl chlorobenzoate, vinyl tetrachlorobenzoate, vinyl naphthoate, and the like; N-vinyl compounds such as N-vinyl oxazolidone, N-vinyl imidazole, N-vinyl pyrrolidone, N-vinyl carbazole, N-vinylethylacetamide, and the like; styrenes, including styrenes wherein carbon atoms in the phenyl ring thereof are substituted and α-substituted styrenes, such as styrene, alkylstyrenes (preferably where the alkyl group has 1 to 18 carbon atoms, most preferably 1 to 10 carbon atoms, e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluromethylstyrene, ethoxymethylstyrene, acetoxymethylstyrene, etc.), alkoxystyrenes (preferably where the alkoxy group has 1 to 10 carbon atoms, most preferably 1 to 5 carbon atoms, e.g., methoxystyrene, 4-methoxy-3-methylstyrene, dimethoxystyrene, etc.) halostyrenes (e.g., chlorostyrene, dichlorostyrene, trichlorostyrene, tetrachlorostyrene, pentachlorostyrene, bromostyrene, dibromosytrene, iodostyrene, fluorostyrene, trifluorostyrene, 2-bromo4-trifluoromethylstyrene, 4-fluoro-3-trifluoromethylstyrene, etc.), carboxystyrenes (e.g., vinylbenzoic acid, methyl vinylbenzoate, etc.), and the like; and crotonates, such as alkyl crotonates (preferably where the alkyl group has 1 to 18 carbon atoms, most preferably 1 to 10 carbon atoms, e.g., butyl crotonate, hexyl crotonate, glycerol monocrotonate, etc.).

Specific examples of compounds having two or more addition-polymerizable unsaturated bonds which, in general, can be used more suitably than those having one additionpolymerizable bond as described above, include:

Polyacrylates and polymethacrylates (wherein the term poly(meth)acrylate refers to compounds containing at least two (meth)acrylate groups) of polyhydric alcohols, most preferably those polyhydric alcohols having from 1 to 10 carbon atoms, preferably 1 to 5 carbon atoms, for example, polyethylene glycol, polypropylene oxide, polybutylene oxide, polycyclohexene oxide, poly(ethylene oxide-propylene oxide), polystyrene oxide, polyoxetane, polytetrahydrofuran, cyclohexenediol, xylylenediol, di(β-hydroxyethoxy)benzene, glycerol, diglycerol, neopentyl glycol, trimethylolpropane, triethylolpropane, pentaerythritol, dipentaerythritol, sorbitan, sorbitol, butanediols, butanetriols, 2-butene-1,4-diol, 2-n-butyl-2-ethyl-propanediol, 2-butyne1,4-diol, 3-chloro-1,2-propanediol, 1,4-cyclohexanedimethanol, 3-cyclohexene-1,1-dimethanol, decanediol, 2,3-dibromo-2-butene-1,4-diol, 2,2-diethyl-1,3-propanediol, 1,5-dihydroxy1,2,3,4-tetrahydronaphthalene, 2,5-dimethyl-2,5-hexanediol, 2,2-dimethyl-1,3-propanediol, 2,2-diphenyl-1,3-propanediol, dodecandiol, meso-erythritol, 2-ethyl-1,3-hexanediol, 2-ethyl2-(hydroxymethyl)-1,3-propanediol, 2-ethyl-2-methyl-1,3-propanediol, heptanediol, hexanediol, 3-hexene-2,5-diol, hydroxybenzyl alcohol, hydroxyethylresorcinol, 2-methyl1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xyleneα,α'-diol, 1,1,4,4-tetraphenyl-1,4-butanediol, 1,1,4,4-tetraphenyl-2-butyne-1,4-diol, 1,2,6-trihydroxyhexane, 1,1'-bi-2-naphthol, dihydroxynaphthalene, 1,1'-methylene-di-2-naphthol, 1,2,4-benzenetriol, biphenol, 2,2'-bis(4-hydroxyphenyl)cyclohexane, bis(hydroxyphenyl)methane, catechol, 4-chlororesorcinol, 3,4-dihydroxycinnamic acid, hydroquinone, hydroxybenzyl alcohol, methylhydroquinone, methyl 2,4,6-trihydroxybenzoate, phloroglucinol, pyrogallol, resorcinol, glucose, α-(1-aminoethyl)-p-hydroxybenzyl alcohol, 2-amino-2-ethyl-1,3-propanediol, 2-amino-2-methyl-1,3-propanediol, 3-amino-1,2-propanediol, N-(3-aminopropyl)-diethanolamine, N,N'-bis-(2-hydroxyethyl)piperazine, 2,2-bis(hydroxymethyl)2,2',2''-nitrilotriethanol, 2,2-bis(hydroxymethyl)propionic acid, 1,3-bis(hydroxymethyl)urea, 1,2-bis(4-pyridyl)-1,2-ethanediol, N-n-butyldiethanolamine, diethanolamine, N-ethyldiethanolamine, 3-mercapto-1,2-propanediol, 3-piperidino-1,2-propanediol, 2-(2-pyridyl)-1,3-propanediol, triethanolamine, α-(1-aminoethyl)-p-hydroxybenzyl alcohol, 3-amino-4-hydroxyphenyl sulfone, and the like, including ethylene glycol diacrylate, diethyleneglycol dimethacrylate, polyethylene glycol diacrylate, pentaerythritol triacrylate, pentaerythritol dimethacrylates, dipentaerythritol pentaacrylate, glycerol triacrylate, diglycerol dimethacrylate, 1,3-propanediol diacrylate, 1,2,4-butanetriol trimethacrylate, 1,4-cyclohexanediol diacrylate, 1,5-pentanediol diacrylate, neopentylglycol diacrylate, ethylene oxide addition products of trimethylolpropane triacrylate, e.g., having up to 10 units of ethylene oxide per mole of triacrylate, etc., which are most suitable with respect to availability among acrylates and methacrylates described above;

Acrylamides and methacrylamides, with preferred acrylamides and methacrylamides including those combined with a diamine, triamine or tetraamine, and containing from 1 to 10 carbon atoms, most preferably such compounds combined with a diamine having a total of 1 to 6 carbon atoms, such as a methylenebisacrylamide, methylenebismethacrylamide, and those which are obtained from reaction between (meth)acrylic acid and the following amines, ethylenediamine, diaminopropane, diaminobutane, pentamethylenediamine, hexamethylene-bis(2-aminopropyl)amine, diethylenetriamine, heptamethylenediamine, octamethylenediamine, polyamines, including diamines, triamines and tetraamines, most preferably diamines, having a total molecular weight of from 46 to about 300, most preferably 60 to about 200, interrupted by one or more hetero atoms, such as —NH—, —N—, —S—, —O—, etc., ring-containing polyamines (preferably those with from 1 to 3 (condensed) aromatic rings, most preferably with 1 ring, e.g., phenylenediamine, xylylenediamine, β-(4-aminophenyl)ethylamine, diaminobenzoic acid, diaminotoluene, diaminoanthraquinone, diaminofluorene, etc.) and the like;

Allyl compounds, such as allyl chloride, allyl bromide, allyl iodide, allyl alcohol, allyl cyanide, diallyl esters of dicarboxylic acids, where the dicarboxylic acids preferably have from 1 to 20 carbon atoms (including the carbon atom of the carboxyl group), most preferably from 1 to 10 carbon atoms, and when a ring-system dicarboxylic acid is used, it preferably has from 1 to 3 (condensed) aromatic rings, most preferably 1 ring, for example, phthalic acid, terephthalic acid, sebacic acid, adipic acid, glutaric acid, malonic acid, oxalic acid, etc., diallyl esters of disulfoxylic acids, preferably those containing from 1 to 20 carbon atoms, most preferably from 1 to 10 carbon atoms and, when a ring-system disulfonic acid is involved, the number of aromatic rings is from 1 to 3 (condensed) aromatic rings, most preferably 1, for example, anthraquinone disulfoxylic acid, 2,5-dihydroxy-pbenzene sulfoxylic acid, dihydroxynaphthalene disulfoxylic acid, naphthalene disulfoxylic acid, etc., diallyl amides, and the like;

Vinyl ethers, which preferably contain from 1 to 9, most preferably from 1 to 4, vinyl groups, such as polyvinyl ethers of the above-described polyhydric alcohols, most preferably those of a molecular weight of from 90 to about 500, most preferably from 104 to 400, for example, ethylene glycol divinyl ether, 1,3,5-tri-$\beta$-vinyloxyethoxybenzene, 1,3-di-$\beta$-vinyloxylethoxybenzene, glycerol trivinyl ether, and the like;

Vinyl esters, preferably esters of vinyl alcohols with a dicarboxylic or tricarboxylic acid having from 1 to 10 carbon atoms, most preferably 1 to 6 carbon atoms (which ranges include the carboxyl carbon), or a disulfonic or trisulfonic acid having from 1 to 10 carbon atoms, most preferably 1 to 6 carbon atoms, such as divinyl succinate, divinyl adipate, divinyl phthalate, divinyl terephthalate, divinylbenzene-1,3-disulfonate, divinylbutane-1,4-disulfonate, and the like; and Styrene compounds, most preferably those styrene compounds wherein a phenyl proton is substituted by a vinyl, alkyl or alkenyl group of from 1 to 10 carbon atoms, most preferably 1 to 5 carbon atoms, such as divinylbenzene, p-allylstyrene, p-isopropenestyrene, and the like.

In addition, compounds having two or more addition-polymerizable unsaturated bonds can also suitably be used in the invention, such as N-$\beta$-hydroxyethyl-$\beta$-(methacrylamido)ethylacrylate, N,N-bis($\beta$-methacryloxyethyl)acrylamide, acrylmethacrylate, and the like.

The preferred monomers include acrylic esters and methacrylic esters with the polyol moiety thereof (polyhydroxy compound) containing from 1 to 6 hydroxy groups.

Combinations of two or more of these monomers can also be used. These monomers are used at an amount of from about 10 to about 500 parts by weight, preferably from 30 to 200 parts by weight, per 100 parts by weight of the polymeric materials used as binders, i.e., components (a) and (d).

As photopolymerization initiators (c), conventional photopolymerization initiation can be used, such as those described, for example, in J. Koser, "Light-Sensitive Systems," Chapter 5, including carbonyl compounds, organic sulfur compounds, peroxides, redox compounds, azo compounds, diazo compounds, halogen compounds, photoreduction dyes, and the like. As is well known to those skilled in the art, such photopolymerization initiators, when exposed to light having a wavelength which the initiators absorb, produce free radicals which initiate free radical addition polymerization. So long as a photopolymerization initiator meets this general criterion, it can be used with success in the present invention. Representative examples of such initiators include:

Carbonyl compounds, such as benzoin, benzoin methyl ether, benzophenone, anthraquinone, 2-methylanthraquinone, 2-t-butyl-anthraquinone, 9,10-phenanthraquinone, diacetyl, and benzil, as well as those represented by the following general formula:

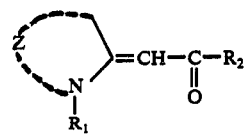

wherein $R_1$ represents an alkyl group of the type ordinarily used in cyanine dyes, wherein the alkyl group preferbly has from 1 to 10 carbon atoms, most preferably 1 to 5 carbon atoms, such as, preferably, an unsubstituted lower alkyl group (e.g., methyl, ethyl, propyl, etc.), a hydroxyalkyl group (e.g., 2hydroxyethyl, etc.), an alkoxyalkyl group (where the alkoxy and alkyl moieties most preferably each has from 1 to 10 carbon atoms, preferably 1 to 5 carbon atoms, e.g., 2-methoxyethyl, etc.), a carboxyalkyl group (e.g., carboxymethyl, 2-caboxyethyl, etc.), a sulfoalkyl group (where the alkyl moiety preferably has from 1 to 10 carbon atoms, most preferably 1 to 5 carbon atoms, e.g., 2-sulfoethyl, 3-sulfopropyl, etc.), an aralkyl group (where the aralkyl ring preferably comprises 1 benzene ring and the alkyl group is a polymethylene group of from 1 to 10 carbon atoms, most preferably from 1 to 8 atoms, e.g., benzyl, phenethyl, p-sulfophenethyl, p-carboxyphenethyl, etc.), a vinylmethyl group, and the like; $R_2$ represents an alkyl group, preferably a lower alkyl group (generally with 1 to 10 carbon atoms in the alkyl group, more preferably from 1 to 5 carbon atoms, e.g., methyl, ethyl, propyl, etc.), an aryl group (where preferred aryl group have from 6 to 15 carbon atoms, most preferably from 6 to 12 carbon atoms and comprise 1 or 2 (condensed) aromatic rings, e.g., phenyl, p-hydroxyphenyl, p-methoxyphenyl, p-chlorophenyl, naphthyl, etc.), or a thienyl group; and Z represents the non-metallic atoms necessary to complete a nitrogen-containing heterocyclic ring as is ordinarily present in cyanine dyes, such as benzothiazoles (e.g., benzothiazole, 5-chlorobenzothiazole, 6-chlorobenzothiazole, 4-methylbenzothiazole, 6-methylbenzothizole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole, 5,6-dimethoxybenzothiazole, etc.), naphthothiazoles (e.g., $\alpha$-naphthothiazole, $\beta$-naphthoselenazole, etc.), benzoselenazoles (e.g., benzoselenazole, 5-chlorobenzoselenazole, 6-methylbenzoselenazole, 6-methoxybenzoselenazole, etc.), naphthoselenazoles (e.g., $\alpha$-naphthoselenazole, $\beta$-naphthoselenazole, etc.), benzoxazoles (e.g, benzoxazole, 5-methylbenzoxazole, 5-phenyl-benzoxazole, 5-methoxybenzoxazole, etc.), and naphthoxazoles (e.g., $\alpha$-naphthoxazole, $\beta$-naphthoxazole, etc.).

Specific examples of compounds represented by the above general formula include 2-benzoylmethylene-3-methyl$\beta$-naphthothiazoline, 2-benzoylmethylene-3-ethyl-$\beta$-naphthothiazoline, 3-ethyl-2-(2-thenoyl)methylene-$\beta$-naphthothiazoline, 3-ethyl2-propionylmethylene-$\beta$-naphthothiazoline, 5-chloro-3-ethyl2-p-methoxybenzolymethylenebenzothiazoline, and the like;

Organic sulfur compounds, such as di-n-butyl disulfide, di-n-octyl disulfide, dibenzyl disulfide, diphenyl disulfide, dibenzoyl disulfide, diacetyl disulfide, 2-mercaptobenzothiazole, 2-mercaptobenzoxazole, 2-mercaptobenzimidazole, thiophenol, thiocresol, p-methoxybenzenethiol, carboxymethyl-N,N-dimethyldithiocarbamate, ethyl-trichloromethanesulfate, and the like;

Peroxides, such as hydrogen peroxide, di-t-butyl peroxide, benzoyl peroxide, methyl ethyl ketone peroxide, and the like;

Redox compounds, such as combinations of ferrous ions and hydrogen peroxide, ferrous ions and persulfate ions, ferric ions and peroxides, and the like;

Azo and diazo compounds, such as $\alpha,\alpha'$-azobisisobutyronitrile, 2-azobis-2-methylbutyronitrile, 1-azo-bis-cyclohexanecarbonitrile, diazonium salt of p-aminodiphenylamine, and the like;

Halogen compounds, such as chloromethylnaphthyl chloride, phenacyl chloride, chloroacetone, $\beta$-naphthalenesulfonyl chloride, xylenesulfonyl chloride, and the like;

Photo-reduction dyes, such as Rose Bengal, erythrosine, Eosine, acriflavine, riboflavin, Thionine, and the like; and Others, such as bis(2-o-chlorophenyl-4,5-diphenylimidazolyl), bis(2-o-fluorophenyl-4,5-diphenylimidazolyl), bis(2-p-methoxyphenyl-4,5-diphenylimidazolyl), bis(2-p-methylmercaptophenyl-4,5-diphenylimidazolyl), bis(2,4,5-triphenylimidazolyl), and the like.

Highly preferred initiators include those of the following formula:

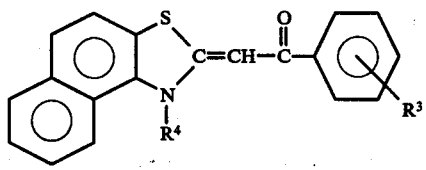

wherein $R^3$, and $R^4$ and alkyl groups of 1 to 5 carbon atoms, even more preferably those of the formula:

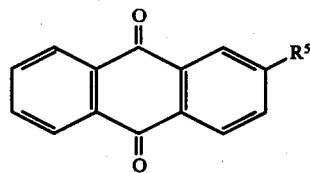

wherein $R^5$ is an alkyl group of 1 to 7 carbon atoms.

The photopolymerization initiator may be used in an amount of from about 0.1 to about 20 parts by weight, preferably from 1 to 10 parts by weight, per 100 parts by weight of the monomer component (b).

In the practice of the invention, a variety of synthetic, semi-synthetic, or naturally-occurring straight-chained polymers can be used as the polymeric material having a molecular weight above about 10,000 as component (d), which is the most characteristic component in this invention and is employed as a part of the binding agents togehter with chlorinated polyolefins. However, in cases where the recording materials of the invention are to be used as a tenting photoresist as described hereinafter, they must polymers which satisfy the following requirements: The polymer should have sufficient compatibility with photosensitive layer-forming components such as chlorinated polyolefins, monomers, and the like, so that no separation of the components occurs during preparation steps including the preparation of coating solutions, coating, and drying; a layer containing the same should have a small elongation at break, i.e., only small elongation even at the amount of stress which breaks the polymer, for example, a 10 to 30% elongation, so that, upon development by stripping, destruction along boundary lines between exposed and unexposed parts can be effected with ease; the inclusion of the polymer into the photosensitive layer should preserve adhesive properties, for example, that the layer adheres more strongly to the support than to the substrate before exposure but that the order of adhesion is reversed after exposure; and the polymer should possess a great breaking strength, e.g., at least about 300 kg/cm$^2$, so that the layer possesses a high shock resistance upon etching.

Examples of polymers which satisfy the above requirements, and, therefore, which can be suitably used as a binding agent together with chlorinated polyolefins include polymethyl methacrylate, polyacrylic acid, polyalkyl acrylates (where the alkyl group has preferably 1 to 10 carbon atoms, most preferably 1 to 5 carbon atoms, e.g., methyl, ethyl, butyl, etc.), copolymers of alkyl acrylates (where the alkyl group has preferably 1 to 10 carbon atoms, most preferably 1 to 5 carbon atoms, e.g., methyl, ethyl, butyl, etc.) and at least one monomer selected from acrylonitrile, vinyl chloride, vinylidene chloride, styrene, butadiene, or the like, polyvinyl chlroide, copolymers of vinyl chloride and acrylonitrile, polyvinylidene chloride, copolymers of vinylidene chloride and acrylonitrile, polyvinyl acetate, copolymers of vinyl acetate and vinyl chloride, polyvinyl alcohol, polyvinyl pyrollidone, polyacrylonitrile, copolymers of acrylonitrile and styrene, copolymers of acrylonitrile, butadiene and styrene, poly(vinyl alkyl ether) (where the alkyl group has preferably 1 to 10 carbon atoms, most preferably 1 to 5 carbon atoms, e.g., methyl, ethyl, isopropyl, butyl, etc.), poly(methyl vinyl ketone), poly(ethyl vinyl ketone), polyethylene, polypropylene, polybutene, polystyrene, poly-$\alpha$methylstyrene, polyamides such as nylon-6, nylon-6,6, etc., poly-1,3-butadiene, polyisoprene, polyurethane, polyethylene terephthalate, polyethylene isophthalate, chlorinated rubbers such as chlorinated polyisoprene, chlorinated polybutadiene, etc., (such materials typically have a degree of chlorination of 60% or more and, simply stated, have no impact upon the chlorination degree of the chlorinated polyolefin(s) used), cyclized rubbers such as cyclized polyisoprene, ethyl cellulose, acetyl cellulose, polyvinyl butyral, polyvinyl formal, styrene-butadiene rubbers, and the like. Other polymers can also be used with advantage if they satisfy the above requirements. In the case of copolymers, those containing a minor component at a ratio of from 10 to 50 mol%, can, in general, be used with advantage (where the minor component is the last recited component and in terpolymers represented by A-B-C, the proportion of the component is A>B>C).

In employing these polymers, the molecular weight thereof is an important factor to impart strength to the resist film. Required molecular weights can be varied over a wide range depending on the properties of polymers used, but, in general, there can suitably be used those having a molecular weight above about 10,000, preferably from about 10,000 to about 2,000,000, and most preferably from about 50,000 to about 1,000,000.

Among the various polymers used in this invention, particularly preferred are polymethyl methacrylate, styrenebutadiene rubber, preferably where the molar ratio of butadiene/(styrene + butadiene) is 0.5 - 0.1, most preferably where the styrene:butadiene molar ratio is 75:25, vinylidene chlorideacrylonitrile copolymers (containing from 10 to 30 mol% of acrylonitrile), cellulose acetate butyrate (where preferred materials have a % acetylation of 1 to 34%, a % butanolylation of 16 to 58% and a % hydrolysis of from 0 to 4%, molar basis), acrylonitrile-butadiene-sytrene copolymers (where preferred terpolymers contain from 20 to 30 mol% acrylonitrile, from 20 to 30 mol% butadiene and from 40 to 60 mol% styrene), ethyl cellulose, chlorinated rubber, and the like.

By altering the ratio of polymers having a molecular weight of more than about 10,000 (component d) to the chlorinated polyolefins (component a), the properties of the recording materials can be controlled, such as the adhesion of the photosensitive layer to the support or base plate of the printed circuit, the ease with which the layer breaks at the boundary of the photopolymerizable layers between exposed and unexposed areas and the properties of pattern-like polymer layers, i.e., the resist or the like, obtained after exposure and development, including mechanical strength (e.g., resistance to impact) elongation, wear resistance, chemical resistance and the like.

The ratio of component (d) to component (a) can, therefore, be varied over a wide range, depending on the use, or kinds and molecular weights thereof, but a suitable content of component (d) is from about 10% to about 90% by weight, preferably from about 20% to 70% by weight, based on the total amount of binder, i.e., the total amount of components (a) and (d).

While not limitative, it is most preferred that components (a), (b) and (d) be utilized in the present invention at the following ratios:

$(d/a + d) = 0.1$ to 0.9, most preferably 0.2 to 0.7 (by weight)

$(b/a + d) = 0.1$ to 5, most preferably 0.3 to 2 (by weight).

Highly superior results are obtained when components (a), (b) and (d) are utilized in an amounts meeting the above limitations.

The photopolymerizable compositions used in the invention which comprise the above components can also advantageously contain a thermal polymerization inhibitor. Examples of useful thermal polymerization inhibitors include p-methoxyphenol, hydroquinone, alkyl-, aryl- or aralkyl-substituted hydroquinones, where preferred alkyl groups have from 1 to 10 carbon atoms, most preferably from 1 to 5 carbon atoms, for example, methyl, ethyl, propyl, etc., where preferred aryl groups are phenyl, tolyl, xylyl, and mesityl, and where preferred aralkyl groups are benzyl, phenethyl and tolylmethyl; t-butylcatechols, pyrogallol, cuprous chloride, phenothiazone, chloranil, naphthylamine, $\beta$-naphthol, 2,6-di-t-butyl-p-cresol, pyridine, nitrobenzene, dinitrobenzene, p-toluidine, Methylene Blue, copper salts of organic acids (e.g., copper acetate, etc.), and the like. The thermal polymerization inhibitors are preferably used at an amount of from about 0.001 to about 5 parts by weight per 100 parts by weight of the monomers.

The photopolymerizable compositions used in the invention can further contain various conventional additives, such as coloring agents, plasticizers, resins, and the like. Examples of useful coloring agents include titanium dioxide, carbon black, iron oxide, pigments such as phthalocyanine and azo dyes, and dyes such as Methylene Blue, Crystal Violet, Rhodamine B, Fuchsine, Auramine, azo dyes, anthraquinone dyes, and the like. The coloring agents are suitably used in an amount of from about 0.1 to about 30 parts by weight (in the case of a pigment), or from about 0.01 to about 10, preferably from 0.1 to 3 parts by weight (in the case of a dye), per 100 parts by weight of the total weight of binders and monomers used. Examples of useful plasticizers include phthalates, such as dimethyl phthalate, diethyl phthalate, dibutyl phthalate, diisobutyl phthalate, dioctylphthalate, octyl capryl phthalate, dicyclohexyl phthalate, ditridecyl phthalate, butyl benzyl phthalate, diisodecyl phthalate, diallyl phthalates, etc., glycol esters, dimethyl glycol phthalate, ethylphthalyl ethylglycolate, methylphthalyl ethylglycolate, butylphthalyl butylglycolate, triethyleneglycol dicaprylate, etc., phosphates, such as tricresyl phosphate, triphenyl phosphate, etc., esters of aliphatic dibasic acids, such as diisobutyl adipate, dioctyl adipate, dimethyl sebacate, dibutyl sebacate, dioctyl azelate, etc., triethylcitric acid, glycerol triacetyl ester, butyl laurate, and the like.

The photopolymerizable compositions used in the invention are dissolved into a solvent to make a coating solution, and then the solution is coated on an appropriate support, and dried. Coating is most conveniently carried out when the photopolymerizable composition comprises about 5 to about 50 weight % of the coating solution.

Examples of useful solvents include ketones, such as acetone, methyl ethyl ketone, methyl isobutyl ketone, cyclohexanone, etc., esters, such as ethyl acetate, butyl acetate, n-amyl acetate, methyl formate, ethyl propionate, dimethyl phthalate, ethyl benzoate, etc., aromatic hydrocarbons, such as toluene, xylene, benzene, ethylbenzene, etc., halogenated hydrocarbons, such as carbon tetrachloride, trichloroethylene, chloroform, 1,1,1-trichloromethane, monochlorobenzene, chloronaphthalene, etc., ethers, such as tetrahydrofuran, diethyl ether, ethylene glycol monomethyl ether, ethylene glycol monoethyl ether, etc., dimethylformamide, dimethylsulfoxide, and the like. The support can be provided, where necessary, with an antihalation layer, or another coating layer required for improving the adhesion thereof to the photopolymerizable composition.

Supports used in this invention should have good light transmittance and uniform surfaces. Examples of supports which can be used in the invention include a variety of plastic films such as of poly(ethylene terephthalate), polypropylene, polyethylene, cellulose triacetate, cellulose diacetate, polyvinyl chloride, polyvinyl alcohol, polycarbonate, polystyrene, cellophane, polyvinylidene chloride copolymers, polyamides, polyimides, copolymers of vinyl acetate, polytetrafluoroethylene, polytrifluoroethylene, and the like. Composite materials which comprise two or more films can also be used.

While the supports, in general, have a thickness of from about 10 to about 150 microns, preferably from 20 to 50 microns, there may also be used those having a thickness greater or smaller than the above values.

The above-described photopolymerizable layer is provided on a support at such a thickness that the final image thereof exhibits the desired functions. In general, the thickness of the layer is from about 5 to about 100 microns, preferably from 10 to 60 microns.

If desired, the recording materials of the invention can be provided with a protective film on the photopolymerizable composition. As such a protective film, there may be used paper, or papers laminated with polyethylene, polypropylene, etc., as well as those employed as the above support. The thickness of the protective film is preferably from about 8 to about 80 microns, more preferably from 10 to 50 microns. In selecting a support and a protective film, the relationship must be satisfied that the adhesion between the photopolymerizable composition and the support is greater than that between the photopolymerizable composition and the protective film. Examples of combinations of a support and a protective film which satisfy the above relationship include these shown in the following Table 1.

Table 1

| | Support | Protective Film |
|---|---|---|
| (1) | Poly(ethylene terephthalate) | Polypropylene |
| (2) | " | Polyethylene |
| (3) | Polyamide (Nylon-6) | " |
| (4) | Poly(vinyl chloride) | Cellophane |
| (5) | Polyimide | Polypropylene |

In addition to the above-described method involving the selection of a protective film which is different from the support, the above adhesion relationship can be satisfied by a surface treatment of at least one of the support and the protective film. In general, the surface of a support can be treated by the application of a subbing layer, corona discharge, flame, ultraviolet irradiation, high-frequency irradiation, glow discharge, activated plasma discharge, laser beams, etc. in order to increase its adhesion to the polymerizable composition. On the contrary, the surface treatment of a protective film is generally carried out by applying thereon a subbing layer of, for example, a polyorganosiloxane, fluorinated polyolefin, polyfluoroethylene, etc., to reduce the adhesion between the photopolymerizable composition and the protective film.

The recording materials of the invention may be prepared as follows: A coating solution is prepared by sufficiently dissolving or dispersing therein a monomer(s), a polymerization initiator(s), the binding agents, and optional components as desired. The coating solution is then coated on a support by any conventional coating procedure and dried. In general, drying is suitably carried out at a temperature of from about 30° C to about 100° C, particularly from 50° C to 90° C, depending on the kind of solvent used. On a commercial scale, drying is conveniently conducted in from about 5 to 20 minutes. Since the surface of the thus prepared recording material is generally highly adhesive, the material is preferably superposed with a protective film as described hereinbefore, so that no adhesion occurs, particularly in cases where it is stored in the form of a roll or in the form of piled sheets.

The recording materials of the invention can be used in the manner as described below to produce images. The photopolymerizable layer of a recording material of the invention is adhered to a desired base plate with the application of pressure after, if it has a protective film, the removal of the film. It is then image-wise exposed through it's transparent supports. As a light source therefor, there may be used those that emit ultraviolet or visible light of from about 350 to about 500 millimicrons, such as a high pressure mercury lamp, a xenon lamp, a carbon arc, a halogen lamp, a fluorescent lamp for duplication, and the like. Other light sources such as laser beams, electron beams, and X-rays may also be used. After the exposure, the support is stripped off, whereby unexposed parts of the photopolymerizable layer are removed with the support, and exposed parts of the layer are left on the base plate to produce an image thereon. While not limitative in any fashion, one skilled in the art will appreciate that exposure times can vary greatly. Exposure times are easily determined utilizing average skill in the art, for example, using a two KW ultra-high pressure mercury lamp at a distance of 50 cm from the photosensitive layer, exposure times from about 10 seconds to about 3 minutes are common.

In cases where an image is produced by the stripping development process as described above, even the recording material described hereinbefore, in which only a chlorinated polyolefin was used as a binding agent, gave a sharp image and had a sufficient resist strength. However, such a recording material was insufficient in strength in cases where a base plate for a printed circuit having through or via holes was employed, and the holes were to be protected by the resist (called tenting).

On the other hand, a recording material whose film strength is improved without impairing image qualities is obtained by using, as binding agents, a chlorinated polyolefin in combination with another polymer having a molecular weight of more than about 10,000 in accordance with this invention. Above all, the recording materials of the invention have excellent properties as a photoresist for preparing printed circuits, particularly as a photoresist for tenting.

The recording materials of the invention can also be used for the production of letter press printing and lithographic printing plates, photography, optical duplication, the production of relief patterns, and the like.

As will be appreciated by one skilled in the art of printed circuit manufacture, it is generally necessary to etch prior to completion of the manufacturing process to eliminate conductor (typically copper) from portions of the substrate which are not covered by the resist image so that only in portions where conductor is covered will the conductive pattern remain on the substrate. In this aspect, the present invention is entirely conventional, i.e., the composition and conditions used for etching can be selected from those conventionally used in the art and can easily betermined by one skilled in the manufacture of printed circuits.

The present invention is further illustrated by the following examples; however, these examples are not to be construed as limiting the scope of the invention.

EXAMPLE 1

Into 50 ml. of methyl ethyl ketone were dissolved at room temperature the following components:

| | Grams |
|---|---|
| Binding Agent | |
| Chlorinated polyethylene (Superchlon CPE-907 LTA*) | 7 |
| Polymethyl methacrylate (Sumipex BLG**) | 3 |
| Monomer | |
| pentaerythritol triacrylate | 14 |
| Photopolymerization Initiator | |
| 2-methylanthraquinone | 0.1 |
| Thermal Polymerization Inhibitor | |
| Hydroquinone | 0.05 |
| Coloring Agent | |
| Copper-phthalocyanine pigment | 0.1 |

*Superchlon CPE-907 LTA: Trade name of a chlorinated polyethylene made by Sanyo Pulp Co., Ltd. having a chlorine content of 69% by weight and having a viscosity of 90 cps. in a toluene solution of 40% by weight of the chlorinated polyethylene at 25° C (hereafter the same).
**Sumipex BLG: Trade name of polymethyl methacrylate (m.w. about 100,000) made by Sumitomo Chemical Co., Ltd.

Portions of this mixture were coated on poly(ethylene terephthalate) film supports using a coating rod, and dried for 20 minutes at 80° C to prepare samples of a recording material. The photosensitive layer had a dry thickness of 35 microns. The surface of a photosensitive layer of one sample was contacted with a clean copper plate for use in printed circuits, and securely laminated by the application of pressure at 25° C. The laminated product was exposed through a negative original with a circuit pattern using a 2 KW high pressure mercury lamp for 1 minute at a distance of 50 cm. from the light source. The poly(ethylene terephthalate) film was then stripped off at 25° C., whereby photochemically cured parts of the layer remained on the copper plate to form a positive image, while uncured parts were removed from the copper plate with the poly(ethylene terephthalate) film.

On the other hand, another sample of the recording material was laminated on a clean copper plate having thereon through holes for use in tenting, and exposed through a negative original for use in tenting for 1 minute as above. The poly(ethylene terephthalate) film was removed to form an image which was provided with complete tenting on it's through holes.

These copper plates were subjected to etching for 1 to 3 minutes in a 40 Bé aqueous ferric chloride solution at 40° C. During this processing cured parts of the photosensitive layers firmly adhered to the copper plates without being peeled off, so that no pin-holes were produced. In addition, the resist film for tenting withstood mechanical impact well due to the spray pressure of a conventional spray etching method, and a copper plate having a tenting yield of approximately 100% was obtained.

The removal of the photosensitive layer was carried out easily by immersion in methylene chloride and then slightly rubbing with cotton pad.

As will be appreciated by one skilled in the art, the resist film formed in accordance with the present invention is removed using essentially conventional techniques. For instance, solvents such as dichloromethane, ethyl dichloride, methyl ethyl ketone, 1,1,1-trichloroethane and the like can be used. Commonly used conditions involve removal at room temperature by immersion for about 10 to about 300 sec. in the solvent, more commonly 30 to 60 sec. Such operations are conventionally performed at atmospheric pressure.

The strength of the resist film was determined by the following method:

The photosensitive mixture was coated to a dry thickness of 35 μ on a poly(ethylene terephthalate) film and dried at 80° C for 20 min. The surface of the photosensitive layer was covered with a polyethylene film having a thickness of 20 microns, and then cut into 10 mm. × 180 mm. pieces. A piece of the film was image-wise exposed using a 2 kw high pressure mercury lamp for 1 minute at a distance of 50 cm. Both the polyethylene and poly(ethylene terephthalate) films were removed, and the resulting polymerized and cured photosensitive layer was employed as a test strip to determine tensile strength using a tensile tester (Tensilon Model UTM-IIIL made by Toyo Measuring Instruments Co., Ltd.).

A test strip was held by two chucks, the distance of the chucks being 50 mm. Maximum load at break was determined 5 times at a moving rate of 5 mm./min. Average tensile strength at break was 730 g.

EXAMPLE 2

Into 50 ml. of ethylene chloride were dissolved at room temperature the following components:

|  | Grams |
|---|---|
| Binding Agent | |
| Ethyl cellulose* | 5 |
| Chlorinated polypropylene (Superchlon CPP-306**) | 15 |
| Monomer | |
| Trimethylolpropane triacrylate | 28 |
| Photopolymerization Initiator | |
| 2-t-Butyl-anthraquinone | 0.1 |
| Coloring Agent | |
| Methylene Blue | 0.05 |
| Heat Polymerization Inhibitor | |
| Hydroquinone | 0.05 |

*Ethyl cellulose: T-50, made by Hercules Inc.; viscosity 45 – 55 cps (in toluene (60-volume)-ethanol (40-volume) at 25° C).
**Superchlon CPP-306: Trade name of a chlorinated polypropylene made by Sanyo Pulp Co., Ltd. having a chlorine content of 69% by weight and having a viscosity of about 95 cps. in 40% by weight toluene solution at 25° C.

The resulting solution was uniformly coated on a poly(ethylene terephthalate) film having a thickness of 25 microns, and dried in the same manner as in Example 1. The photosensitive layer had a dry thickness of 35 microns. A protective polyethylene film was applied on the surface of the photosensitive layer, and the resulting product was allowed to stand at room conditions for 1 month. No change was observed even at the end of this period. After the removal of the polyethylene film, the recording material was laminated to a copper plate for a printed circuit at 50° C., exposed through an original for 50 sec. at 50° C. in the same manner as in Example 1, and then poly(ethylene terephthalate) film was stripped to give a good resist pattern. This procedure was repeated using a through hole base plate for tenting and a negative original for tenting. The resist pattern and resist film for tenting had qualities as sharp and as uniform as those prepared a month earlier, and no reduction was observed in the strength or sensitivity of the resists.

The thus formed copper plates were subjected to etching in a etching solution as described below containing ammonium persulfate as the main component. The resist showed good etching resistance without being peeled off or destroyed, and the tenting resist film was also retained almost completely.

The tensile strength was determined in the same manner as in Example 1. Average tensile strength at break of 5 test strips was 520 g.

| Etching Solution | |
|---|---|
| Ammonium Peroxodisulfate | 240 g |
| 96% Sulfuric Acid | 23 ml |
| Water to make | 1 l |
| Etching Conditions: | |
| 40 – 45° C, 1 – 3 min. | |

EXAMPLE 3

Onto a poly(ethylene terephthalate) film was coated to a dry thickness of 25 μ a photosensitive solution consisting of the following compositions:

| | | Grams |
|---|---|---|
| Styrene-butadiene rubber (Solprene T-475*) | 6 | |
| Chlorinated polyethylene (Elaslene-401A) | 5 | " |
| Diglycerol trimethacrylate | 18 | " |
| 1-methyl-2-benzoylmethylene-β-naphthothiazoline | 0.5 | " |
| p-methoxyphenol | 0.2 | " |

-continued

| | | |
|---|---|---|
| Carbon black having an average particle size of 20 μ. | 0.2 | " |
| Ethylene chloride | 50 | ml. |

*Solprene T-475: Trade name of Asahi Chemical Industry Co., Ltd. for a styrene-butadiene rubber (Specific gravity 0.94 (25° C) measured according to ASTM D297)
**Elaslene-401A: Trade name of Showa Denko K.K. for a chlorinated polyethylene having a chlorine content of 40%, a specific gravity of 1.20, and a Mooney viscosity of 80 (MS4', 100° C.)

and dried for 10 minutes at 80° C. This recording material was laminated to a base plate for use in printed circuits having tenting through holes, and exposed in the same manner as in Example 1. The material was developed by peeling off from the support at 40° C., and subjected to etching in an aqueous 3 mole/liter sodium chloride solution saturated with cupric chloride. The tenting pattern was retained almost completely without being destroyed by the etching procedure. Tensile strength at break was determined in the same manner as in Example 1. Average tensile strength at break of 5 test pieces was 530 g.

EXAMPLES 4–7

Photosensitive solutions were prepared using, in place of polymethyl methacrylate in the photosensitive solution in Example 1, the following materials in the same amount:
4. Acrylonitrile-butadiene-styrene copolymer (Litac ABS 3100, made by Mitsui-Toatsu Chemicals, Inc.; containing 20 to 30 mol % of acrylonitrile, 20 to 30 mol % butadiene and 40 to 60 mol % styrene);
5. Vinylidene chloride-acrylonitrile copolymer (Saran F-220, made by Asahi Dow Co., Ltd.; containing 80 mol % vinylidene chloride and 20 mol % acrylonitrile);
6. Chlorinated rubber (CR-5, made by Asahi Electro-Chemical Co., Ltd.; having a molecular weight of about 50,000 and a chlorine content of about 65 weight %); or
7. Cellulose acetate butyrate (EAB-500, made by Eastman Kodak Co.; degree of hydroxylation about 1%, degree of acetylation about 7%, degree of butanoylation about 48%, all molar)

Each of the solutions was coated, dried, laminated, exposed, and developed by stripping as in Example 1 to form an image on a copper plate with through holes for use in tenting. In each case, an excellent image was obtained, and the tenting resist film had sufficient strength to survive the impact of spraying of etching solution. Average tensile strength at break of the material of each example was as shown in the following table.

| Example | Tensile Strength at Break* |
|---|---|
| 4 | 580 g |
| 5 | 480 g |
| 6 | 450 g |
| 7 | 540 g |

*Average value of 5 test pieces

COMPARATIVE EXAMPLE

The following materials were dissolved or dispersed into 50 ml. of methyl ethyl ketone.

| | Grams |
|---|---|
| Chlorinated polyethyelene (Superchlon CPE-970 LTA) | 10 |
| Pentaerythritol trimethacrylate | 13 |

-continued

| | Grams |
|---|---|
| 2-methylanthraquinone | 0.2 |
| Hydroquinone | 0.1 |
| Copper-phthalocyanine pigment | 0.2 |

The resulting photosensitive mixture was coated and dried as in Example 1. The photosensitive layer had a dry thickness of 35 microns. This recording material was treated and subjected to tensile strength determination as in Example 1. Average tensile strength at break of 5 test pieces was 95 g. In the case where the material was used for tenting, the resist film was incapable of withstanding mechanical impact during etching, and was destroyed.

While the invention has been described in detail and with reference to specific embodiments thereof, it will be apparent to one skilled in the art that various changes and modifications can be made therein without departing from the spirit and scope thereof.

What is claimed is:
1. A recording material comprising a support having thereon a layer of a photopolymerizable composition comprising (a) a binder combination, (b) a monomer having at least one addition-polymerizable unsaturated bond, and (c) a photopolymerization initiator, wherein the improvement comprises that said binder combination (a) consists of (1) a chlorinated polyolefin having a polymerization degree of from about 300 to about 20,000 and a chlorine content from about 40 to about 75% by weight based on the total resin weight selected from the group consisting of chlorinated polyethylene and chlorinated polypropylene, and (2) a straight-chained polymeric material having sufficient compatibility with said components (1), (b) and (c) and, a molecular weight above about 10,000, the ratio of component (2) to component (1) being from about 10% to about 90% by weight based on the total amount of said binder combination, the ratio of component (2) to the sum of components (1) and (2) being 0.1 to 0.9 by weight, and the ratio of component (b) to the sum of components (1) and (2) being 0.1 to 5 by weight.
2. The recording material of claim 1, wherein said chlorinated polyolefin is chlorinated polyethylene.
3. The recording material of claim 2, wherein the degree of chlorination of the chlorinated polyethylene is from 65 to 72% by weight.
4. The recording material of claim 1, wherein said monomer is an acrylic ester or a methacrylic ester comprising a polyol moiety containing from 1 to 6 hydroxy groups.
5. The recording material of claim 1, wherein said photopolymerization initiator is of the formula

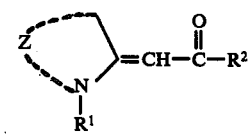

wherein $R_1$ and $R_2$ are alkyl groups of from 1 to 5 carbon atoms; and Z represents the non-metallic atoms necessary to complete a nitrogen-containing heterocyclic ring as is ordinarily present in cyanine dyes.
6. The recording material of claim 1, wherein said photopolymerization initiator has the formula

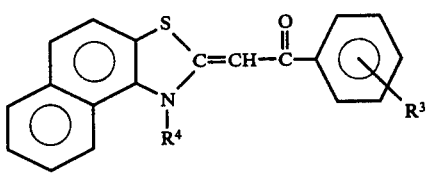

wherein $R_3$ and $R_4$ are alkyl groups from 1 to 5 carbon atoms.

7. The recording material of claim 1, wherein said photopolymerization initiator has the formula

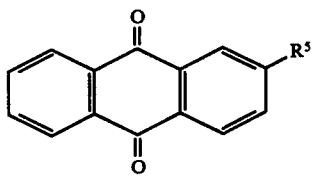

wherein $R_5$ is an alkyl group of from 1 to 7 carbon atoms.

8. The recording material of claim 1, wherein said polymeric material is selected from the group consisting of polymethacrylates, styrene-butadiene copolymers wherein the ratio of butadiene (styrene plus butadiene) is from 0.5 to 0.1, vinylidene chloride-acrylonitrile copolymers wherein the percent of acrylonitrile is between 10 and 30 mole%, cellulose acetate butyrate having a % acetylation of 1 to 34% a % butanoylation of from 16 to 58% and a % hydrolysis of 0 to 4%, ethyl cellulose and acrylonitrile-butadienestyrene copolymers comprising 20 to 30% acrylonitrile, 20 to 30% butadiene and 40 to 60% styrene, all on a molar basis.

9. The recording material of claim 1, wherein the polymeric material has a molecular weight of from 10,000 to about 1,000,000.

10. The recording material of claim 9, wherein the polymeric material has a molecular weight of from 10,000 to 500,000.

* * * * *